United States Patent [19]

Chino et al.

[11] Patent Number: 4,597,173
[45] Date of Patent: Jul. 1, 1986

[54] ELECTRONIC MODULE INSERTION AND RETRACTION MECHANISM

[75] Inventors: John J. Chino, Arnold; David S. Swayne, Baltimore; Richard J. Gilmour, Pasadena, all of Md.

[73] Assignee: The United States of America as represented by the Secretary of the Navy, Washington, D.C.

[21] Appl. No.: 622,370

[22] Filed: Jun. 20, 1984

[51] Int. Cl.⁴ ............................................. B23P 19/02
[52] U.S. Cl. ..................................... 29/741; 29/758; 29/764; 339/45 M; 339/75 MP
[58] Field of Search .................. 29/741, 758, 762, 764; 339/45 R, 45 M, 75 R, 75 M, 75 MP

[56] References Cited

U.S. PATENT DOCUMENTS

| | | | |
|---|---|---|---|
| 2,746,022 | 5/1956 | Gilbert | 339/45 M |
| 2,761,108 | 8/1956 | Jackson et al. | 339/45 M |
| 3,467,891 | 9/1969 | Mogle | 339/75 MP |
| 3,707,696 | 12/1972 | Carter | 339/75 MP |
| 3,944,311 | 3/1976 | Sprenkle et al. | 339/75 MP |
| 4,128,288 | 12/1978 | Zachry et al. | 339/75 MP |
| 4,211,458 | 7/1980 | Kent | 339/75 MP |
| 4,318,157 | 3/1982 | Rank et al. | 339/75 MP |

Primary Examiner—Mark Rosenbaum
Assistant Examiner—P. W. Echols
Attorney, Agent, or Firm—Robert F. Beers; Henry Hansen; Vincent T. Pace

[57] ABSTRACT

A mechanism for inserting and aligning electronic modules, especially in dense configurations, is provided with removable ring or sleeve whereby the module assemblies may be automatically retracted. The removable ring or sleeve is installed near the threaded end of each mounting shaft. When a shaft is unscrewed from the chassis the ring or sleeve bears against a shoulder formed in the end-portion of the module assembly heat sink frame, thereby providing a lifting force on the module assembly. The ring or sleeve is easily installed or removed through an opening in the side of the end-portion.

3 Claims, 5 Drawing Figures

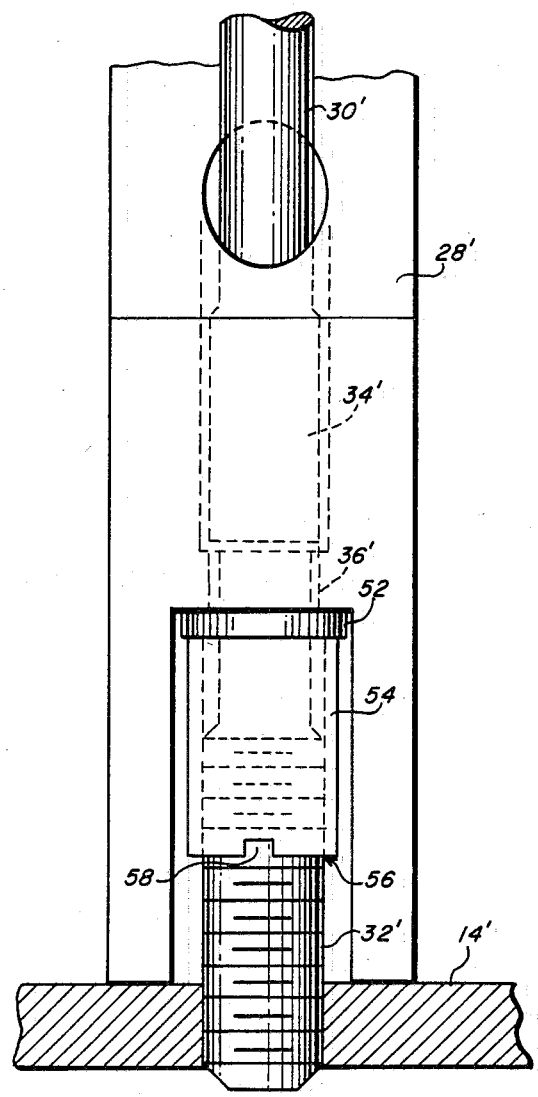
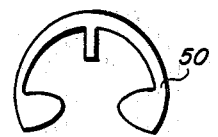
FIG. 4
FIG. 5

ELECTRONIC MODULE INSERTION AND RETRACTION MECHANISM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to chassis mounted electronic modules, and more particularly to a mechanism for positively inserting and retracting such modules.

The use of electronic modules in electronic equipment is well-known and ever-growing. As it continues to grow, greater densities of modules in a given piece of equipment become necessary. This is especially true in compact systems such as those used on aircraft and space vehicles.

Most electronic modules, such as those which contain printed circuit boards, microprocessors, substrates, etc., have some kind of pin contacts disposed along their edges for mating with contacts mounted on the equipment main chassis. In order to assure good electrical contact the mating tolerances must be extremely close. Thus, there are often very high friction forces to be overcome when installing or removing a module. In dense configurations it is often impossible to apply sufficient manual force to insert or retract the module assemblies.

Also, the pin and mating contacts must often be blind-mated in very dense arrangements of such modules. Therefore it is necessary that the module be properly aligned during insertion or retraction, otherwise the pin contacts could be bent or broken.

Wedge-lock mechanisms are currently employed on electronic module assemblies to provide a positive tie-down when the assemblies are inserted into the mating assemblies in the main chassis. The wedging action provides good thermal interface for the module assemblies which are usually in-line cooled. While the wedge-lock mechanism is a good locking device, there are some shortfalls in present devices.

For example, there is no mechanical advantage for the engagement of units where insertion forces are required beyond those achievable by manual operations. In devices which have some means for mechanical advantage a separate tool is usually required for operation. Most of the devices have no integral extracting capability. Consequently, separate extracting provisions must be made and these provisions are made at the expense of critical volume limitations.

SUMMARY OF THE INVENTION

Accordingly, one object of this invention is to provide necessary mechanical advantage for inserting and retracting electronic modules in a main chassis.

Another object of this invention is to provide proper alignment of blind-mated contacts between an electronic module and an equipment chassis.

A further object of this invention is to provide sufficient force to retract electronic modules installed in dense configurations.

A still further object of this invention is to be easily removable for repair and maintenance.

The above and other objects are realized in an electronic module assembly having end-portions formed at its ends. The end-portions each contain an elongated shaft. A circumferential shoulder is formed in each of the end-portions against which a widened-diameter segment of or collar on the shaft may bear for exerting an insertion force. The elongated shafts also have threaded ends for engaging like-threaded openings in the chassis in which the modules are mounted. Removable rings or sleeves are affixed to the shafts between the threaded end and the widened-diameter segment such that when the shafts are unscrewed the rings or sleeves will bear against the opposite side of the circumferential shoulder, thereby exerting an extraction force on the module assembly.

Other objects, advantages, and novel features of the invention will become apparent from the detailed description of the invention which follows the accompanying drawings wherein:

BRIEF DESCRIPTION OF THE DRAWINGS

FIG. 4 shows a removable snap-ring used in the embodiment of FIG. 1; and

FIG. 5 shows an alternate embodiment of the subject invention.

DETAILED DESCRIPTION OF THE INVENTION

Figure 1:
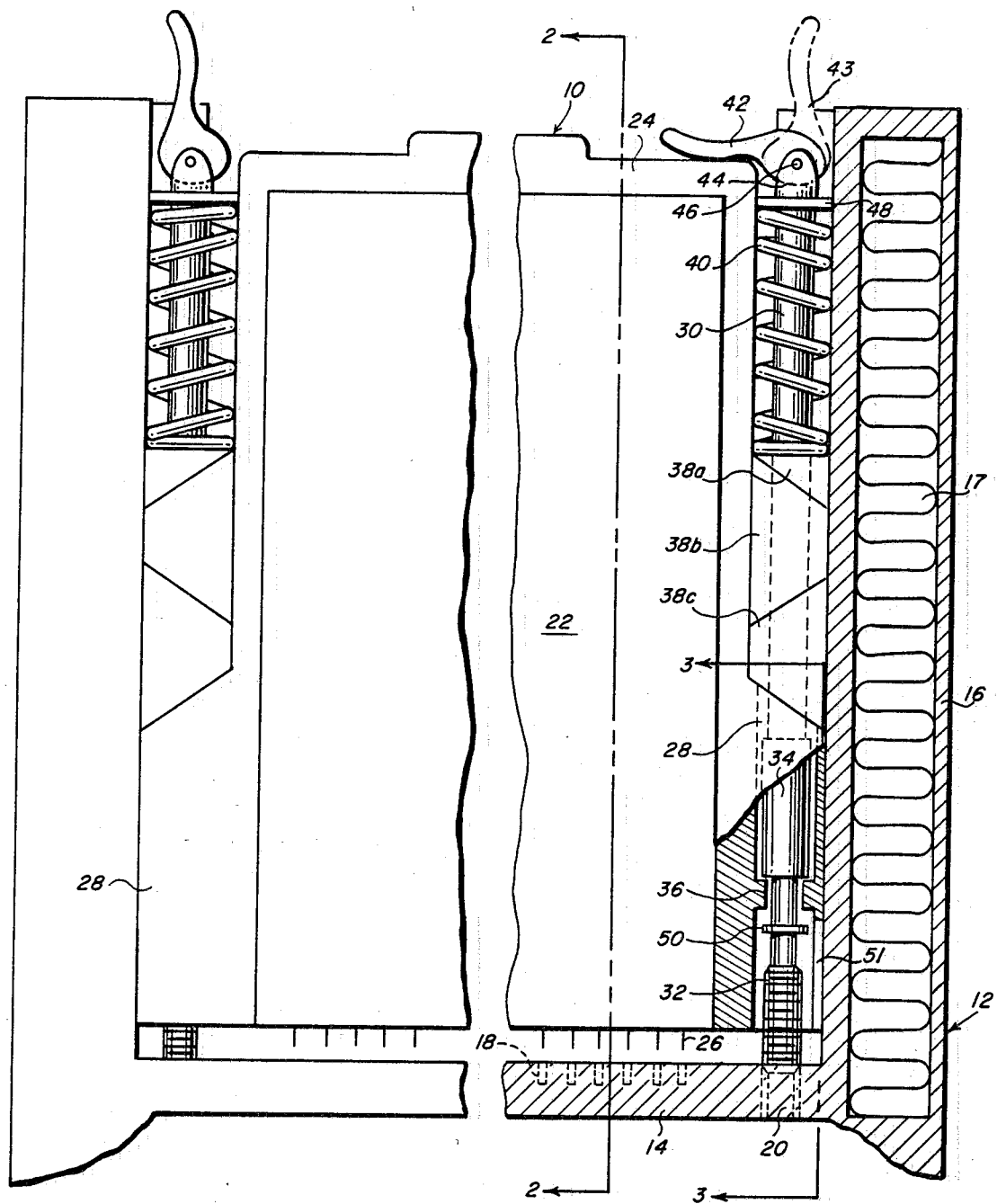
FIG. 1 is a cut-away view of one embodiment of the invention during insertion of a circuit board module assembly into or retraction from a chassis.
Figure 2:
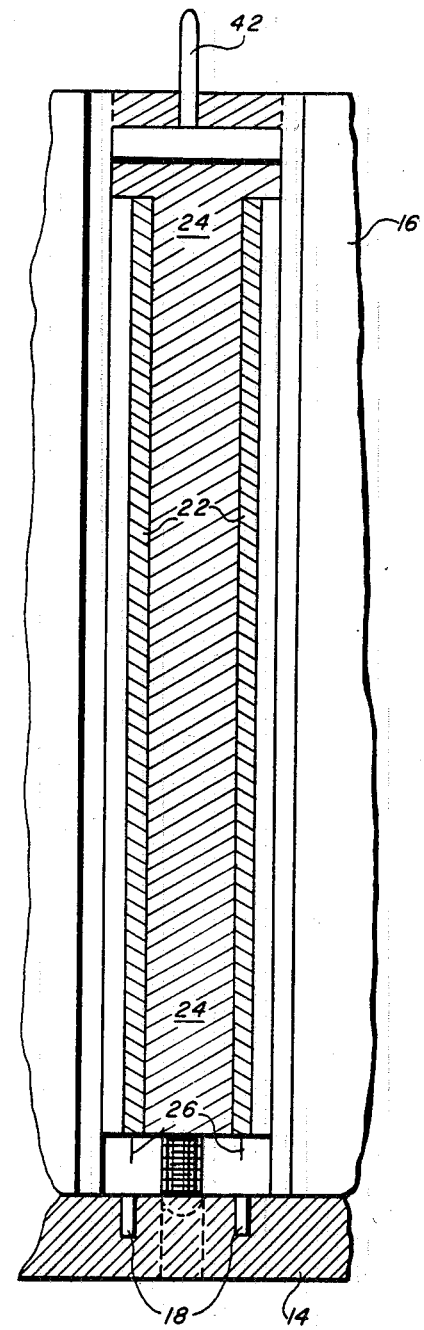
FIG. 2 is a cross-sectional view of the invention taken along the line 2—2 of FIG. 1.

Referring now to FIGS. 1 and 2 there is shown an electronic module assembly 10 having two printed circuit board modules 22, each with a row of pin contacts 26, at some stage of insertion into or extraction from a main chassis 12. The chassis 12 consists of a base plate 14 and end-walls 16 having air passages 17 for removing heat. Base plate 14 has two rows of female contacts 18 embedded therein for engaging with the corresponding pin contacts 26, as well as threaded openings 20 at either end. The threaded openings 20 align the pin contacts 26 with the female contacts 18.

The circuit board modules 22 are mounted on a heat sink frame 24 in assembly 10. It is to be understood that in certain other applications microprocessors, substrates or some other mountable electronic modules could be utilized in lieu of or in combination with the printed circuit board modules 22. Heat sink frame 24 has end portions 28 formed on both ends. Each end portion 28 is bored through for receiving one end of an elongated shaft 30. The shaft 30 has a threaded end 32 which protrudes from the mating end of frame 24 for engaging with threaded opening 20. Shaft 30, and its complement on the other end are aligned with the rows of pin contacts 26 such that when the shafts 30 are screwed into the openings 20, the pin contacts 26 will line up and mate with the female contacts 18.

Shaft 30 also has a widened diameter segment or collar 34 disposed a short distance from the threaded end 32. This collar 34 bears against one surface of a circumferential shoulder 36 formed in the bore of end-portion 28. This action exerts an insertion force on the electronic module assembly 10, thereby driving it into position.

The module assembly 10 may be locked in place by means of wedges 38a, 38b and 38c which are slidably mounted on shaft 30. Wedges 38a,b,c may be any suitable material to facilitate heat transfer. A compressive force is exerted on the wedges 38a,b,c by a coil spring 40 axially mounted on shaft 30. Coil spring 40 is compressed and relaxed by means of a levered cam 42. A trunnion 44 is secured to the end of shaft 30, and levered cam 42 is rotatably fastened to the trunnion 44 by a retaining pin 46.

A retaining disc 48 is interposed between trunnion 44 and coil spring 40 for transmitting the rotation of levered cam 42 about pin 46 from the vertical to horizontal position into a compressive force on spring 40. As spring 40 is compressed the wedges 38a,b,c move laterally to provide good thermal interface between the heat sink frame 24 and the endwall 16. The wedging action also provides sufficient friction between the heat sink frame 24 and endwall 16 to lock the electronic module assembly 10 in place.

Figure 3:
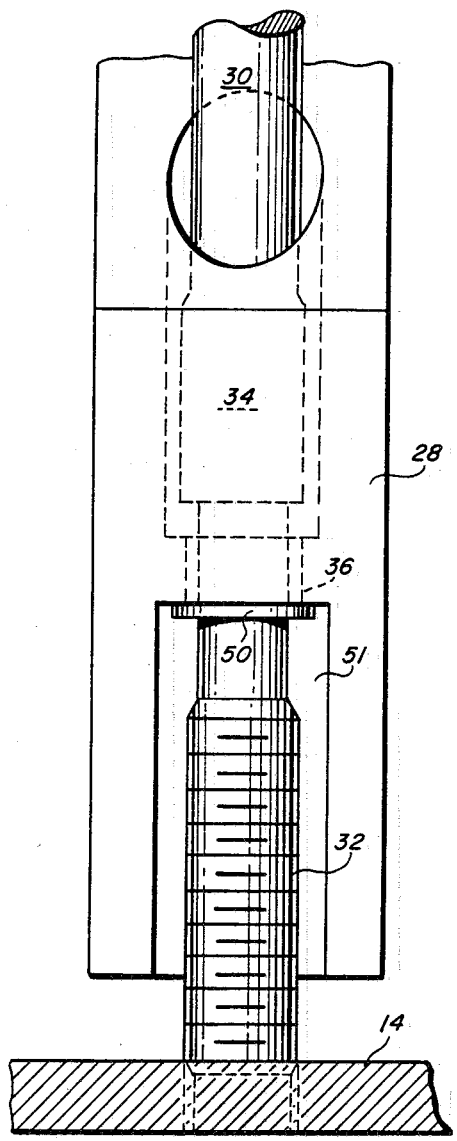
FIG. 3 is an end view of the invention as viewed along the line 3—3 of FIG. 1.

Referring now to FIG. 3 there is shown a more detailed view of the embodiment illustrated in FIG. 1. A retaining ring 50, such as the type shown in FIG. 4, is installed in a groove (not shown) formed in shaft 30 between the threaded end 32 and the collar 34. This retaining ring 50 is positioned such that when shaft 30 is unscrewed from the chassis base 14, it will bear against the other side of shoulder 36, thereby providing an extraction force on electronic module assembly 10.

An opening 51 is formed in the side of end-portion 28 to facilitate installation and removal of the retaining ring 50. Thus, assembly of the insertion/retraction mechanism is a simple procedure of inserting shaft 30, assembled with wedges 38a,b,c, spring 40, and levered cam 42, into end-portion 28, and then installing retaining ring 50 on the shaft 30 through opening 51. It is readily apparent that disassembly is equally facile.

FIG. 5 illustrates an alternate embodiment of the subject invention which would be better for removing heavier electronic module assemblies. In this embodiment there is also an end-portion 28' which receives a shaft 30' having a widened diameter segment or collar 34' and a threaded end 32'. A circumferential shoulder 36' is formed in the bore of end-portion 28'. As in the first embodiment, the collar 34' bears against one side of shoulder 36' when shaft 30' is screwed into the base 14'. In this embodiment, however, a threaded sleeve 54 screws onto the threaded end 32' of shaft 30' for bearing against the other side of the shoulder 36. The sleeve 54 is locked in place at the proper location by a thread locking adhesive 56 or other locking means. A stainless steel spacer ring 52 may be positioned between the sleeve 54 and shoulder 36', to prevent wear. Sleeve 54 has slots 58 at one end to facilitate installation, adjustment, and removal.

Operation of the subject invention can be understood by referring back to FIG. 1. When it is desired to insert an electronic module assembly 10, the assembly 10 is positioned in the chassis 12 such that the threaded ends 32 of the shafts 30 line up with the threaded openings 20 in the chassis base 14. This will assure proper alignment of pin contacts 26 with female contacts 18.

At this stage the levered cam 42 is in its vertical or unlocked position as shown by the dashed line in FIG. 1. The levered cam 42 may be axially rotated such that the threaded end 32 of shaft 30 is screwed into threaded opening 20 in base 14. When module assembly 10 is thus fully inserted, the levered cam 42 is moved to its horizontal or locked position. In this position the cam portion 43 bears against retaining disc 48 causing the spring 40 to compress. As the spring 40 compresses the wedges 38a,b,c move laterally with respect to shaft 30 to provide good thermal contact with the chassis end wall 16.

When it is desired to remove module assembly 10 the procedure is merely reversed. Levered cam 42 is flipped to its vertical position thereby relieving the pressure on spring 40. As the levered cam 42 is rotated to unscrew the shaft 30 from the base 14, retaining ring 50 bears against the shoulder 36 in end portion 28 to provide a lifting force whereby the electronic module assembly may be extracted evenly without damage to the pin contacts 26 or any of the components of the circuit board module 22.

Some of the many advantages and features of the above-disclosed invention should now be apparent in view of the foregoing description. For example, a novel device has been described which provides mechanical advantage for inserting and retracting electronic modules in a main chassis. The device also provides proper alignment of the blind-mated contacts between the module assembly and the chassis. Additionally, this device can provide enough force to retract electronic modules even when installed in dense configurations. Moreover, it is readily removable for repair and maintenance.

Numerous additional modifications and variations of the subject invention are possible in light of the above teachings.

It is therefore to be understood that within the scope of the appended claims, the invention may be practiced otherwise than as specifically described herein.

What is claimed is:

1. Apparatus for inserting and retracting a printed circuit board in a chassis, said chassis including a base, two opposed walls, rows of female electrical contacts mounted in the base, and threaded openings in said base proximate each end of said rows, the board including a row of pin contacts along one side for mating with the female contacts, comprising:

a heat sink frame for mounting the board thereon and for sliding between the walls, said heat sink frame having a cylindrical bore at each end for aligning with the threaded openings;

a circumferential shoulder within each bore positioned along the length thereof intermediate of the bore ends;

an elongated shaft carried axially in each bore and threaded at one end for engaging with one of the threaded openings in the base;

a collar fixed to each shaft between said shoulder and the other end of said shaft for applying an insertion force to the board when said shaft is threaded into the base of the chassis; and flange means removably mounted on each shaft between said shoulder and said threaded end for applying a retraction force to the board when said shaft is threaded out of the base of the chassis, the distance of said means from said collar exceeding the length of said shoulder for allowing partial thread engagement before the insertion or retraction force is applied.

2. Apparatus as recited in claim 1 wherein said flange means comprises a snap-ring seated in a circumferential groove on said elongated shaft.

3. Apparatus as recited in claim 1 wherein said flange means comprises a threaded sleeve screwed onto the threaded end of said shaft, and means for locking said threaded sleeve in place.

* * * * *